United States Patent [19]

Gupta et al.

[11] Patent Number: 4,617,237

[45] Date of Patent: Oct. 14, 1986

[54] PRODUCTION OF CONDUCTIVE METAL SILICIDE FILMS FROM ULTRAFINE POWDERS

[75] Inventors: Arunava Gupta, Madison; Gary A. West, Dover; James T. Yardley, Morristown, all of N.J.

[73] Assignee: Allied Corporation, Morris Township, Morris County, N.J.

[21] Appl. No.: 609,628

[22] Filed: May 14, 1984

[51] Int. Cl.$^4$ .................. B05D 3/06; B05D 5/12; B32B 9/04; B32B 19/00

[52] U.S. Cl. .................. 428/446; 427/53.1; 427/126.1; 427/190; 428/689

[58] Field of Search .......... 204/157.1 R, 157.1 L; 423/341; 427/53.1, 190, 126.1; 428/446, 689

[56] References Cited

U.S. PATENT DOCUMENTS

| | | | |
|---|---|---|---|
| 3,364,087 | 1/1968 | Solomon et al. | 427/253 X |
| 4,042,006 | 8/1977 | Engl et al. | 427/102 X |
| 4,227,907 | 10/1980 | Merritt | 65/3 |
| 4,260,649 | 4/1981 | Dension et al. | 427/53.1 |
| 4,270,997 | 6/1981 | Merritt | 204/157.1 |
| 4,324,854 | 4/1982 | Beauchamp et al. | 430/296 |
| 4,522,845 | 6/1985 | Powell et al. | 427/88 X |

FOREIGN PATENT DOCUMENTS 901784 7/1962 United Kingdom .................. 501/96

OTHER PUBLICATIONS

Shibata, T. et al., *Metal Silicon Reactions Induced by CW Scanned Laser and Electron Beams*, pp. 637-644, Mar. 1981.
Nancy Stauffer, The Industrial Liaison Program of the Massachusetts Institute of Technology, Jul./Aug. 1984, vol. XII, No. 7, "Reports on Research", pp. 1 and 2.
Murarka, Refractory Silicides for VSLI Production, Academic Press, 1983, pp. 115-131.
Wahl et al., The CVD Deposition of Ti-Si Containing Coatings on Ni-Base Superalloys, Proceedings of the Eighth Int. Conference on Chemical Vapor Deposition, Electrochemical Society, Pennington, NJ, 1981, pp. 685-698.
Cold Wall, Low Pressure CVD Reactor, Solid State Technology, Nov. 1983, pp. 63-64.
Brors et al., Properties of Low Pressure CVD Tungsten Silicide as Related to IC Process Requirements, Solid State Technology, vol. 26, Apr. 1983, pp. 183-186.
Plasma Titanium-Silicide . . . Path of Least Resistance, Solid State Technology, Jan. 1984, p. 37.
Bilenchi et al., Laser-Enhanced Chemical Vapor Deposition of Silicon; Proceedings of the Eighth International Conference on Chemical Vapor Deposition, Electrochemical Society, Pennington, NJ, 1981, pp. 275-283.
Gattuso et al., IR Laser-Induced Deposition of Silicon Thin Films, Mat. Res. Soc. Proc., vol. 17, 1983, pp. 215-222.
Allen et al., Summary Abstract: Properties of Several Types of Films Deposited by Laser CVD, Vac. Sci. Technol., Mar. 1983.
Meunier et al., Hydrogenated Amorphous Silicon Produced by Laser Induced Chemical Vapor Deposition of Silane, Appl. Phys. Lett. 43(3), Aug. 1, 1983, pp. 273-275.
Steinfeld, Laser-Induced Chemical Reactions: Survey of the Literature, 1965-1979, Plenum: NY, 1981, pp. 243-267.

*Primary Examiner*—Michael R. Lusignan
*Attorney, Agent, or Firm*—Gus T. Hampilos; Gerhard H. Fuchs

[57] ABSTRACT

A method of producing a thin film comprising a conductive metal silicide and the products produced therefrom are disclosed. The method is much less complex than methods employed in the prior art for producing conductive thin films and the method reduces substrate damage by maintaining processing temperatures at about 1,000° C. or less. The process employs a stable suspension comprising ultrafine powders in a solvent. This suspension is deposited on a surface of a substrate and is subsequently heated to form a thin conductive film. The thin conductive film comprises polycrystalline metal silicide, preferably a refractory metal silicide, and may also contain silicon. Composites comprising the thin conductive films and a substrate are also disclosed. The process and products are particularly suited for use in VLSI and VVLSI production.

19 Claims, 5 Drawing Figures

PRODUCTION OF CONDUCTIVE METAL SILICIDE FILMS FROM ULTRAFINE POWDERS

This application is related to U.S. Pat. No. 4,568,565, entitled "LIGHT INDUCED CHEMICAL VAPOR DEPOSITION OF CONDUCTIVE TITANIUM SILICIDE FILMS", and U.S. Pat. No. 4,558,017, entitled "LIGHT INDUCED PRODUCTION OF ULTRAFINE POWDERS COMPRISING METAL SILICIDE POWDER AND SILICON".

FIELD OF THE INVENTION

This invention relates to the production of conductive polycrystalline metal silicide-containing films. More particularly, it relates to the production of conductive films from a deposited layer comprising ultrafine metal silicide powders. Specifically, the inventive process is directed to the production of a suspension comprising the ultrafine metal silicide powders which is deposited onto a surface of a substrate and subsequently heated to produce a thin conductive film.

BACKGROUND OF TH INVENTION

The evolution of the electronics industry in recent years has resulted in a steady decrease of integrated circuit feature sizes. With the introduction of the 256K chip and research on the 512 K chip in progress, feature sizes are shrinking to such a degree that many of the traditional semiconductor processing techniques are no longer adequate. Until recently, doped polysilicon has been used extensively as a conductor for gates and gate interconnects on metal-oxide semiconductor (MOS) devices. Doped polysilicon was chosen because it can withstand subsequent high temperature processing steps and because it has electrical properties, such as a bulk resistivity of about 1,000 $\mu\Omega$-cm, which are desirable. As conductor line widths are reduced to below $2\mu$, however, the resistance of polysilicon conductive lines is large enough to degrade the high speed performance of devices. Thus, with minimum feature sizes of $1\mu$ or less, the electronics industry has looked to refractory metal silicides as a solution to gate and gate interconnect problems in high density chip production.

Refractory metal silicides are now being used in place of polysilicon or in addition to polysilicon (as a two layer polysilicon-silicide conductor sometimes referred to as a polycide). Refractory metal silicides have very low bulk resistivities (approx. 15–100 $\mu\Omega$-cm), can withstand temperatures in excess of 1,000° C. and, in general, do not oxidize easily. The silicides commonly associated with the formation of gate interconnects are titanium silicide ($TiSi_2$), tungsten silicide ($WSi_2$), molybdenum silicide ($MoSi_2$) and tantalum silicide ($TaSi_2$).

The term metal silicide as used herein is defined as a metallic compound having the general formula $M_xSi_y$ where M=a metal, $0 < x \leq 1$ and $0 < y \leq 1$.

Currently, a variety of methods are employed to produce conductive silicide coatings. They include sputtering or co-sputtering techniques, evaporation or co-evaporation processes, chemical vapor deposition processes requiring high substrate temperatures (pre- or post-deposition), and plasma induced chemical vapor deposition. For a detailed discussion of many of these methods see Murarka, *Refractory Silicides for VSLI Production*, Academic Press, 1983, pp. 115–31.

Sputtering techniques employ target materials which are bombarded by energized ions to free atoms of the material for deposition onto a substrate. The techniques include sputtering of a metal or silicon or polysilicon or simultaneously sputtering from two targets (co-sputtering). Both techniques employ radio frequency (RF, plasma) or direct current (DC) magnetron sputtering for silicide formation.

DC magnetron sputtering is of limited use because it requires that the target material be a conductor. Thus, when a metal target and a silicon target are employed in a co-sputtering process, the silicon target must be doped to make it a good conductor. Consequently, the resultant silicide layer may include an unwanted dopant.

Sputtering techniques cause gas entrapment and/or contamination to incur in the deposited layer. The bombarding ions are gas ions which become entrapped in the silicide layer. These gas ions can chemically contaminate the layer if the gas contains a chemically reactive impurity.

Silicide coatings produced by the physical deposition process of sputtering or co-sputtering are invariably amorphous. These amorphous coatings have a high resistivity as deposited and must be annealed at 900° C.–1,100° C. for 0.5–1.0 hr. to produce high quality coatings of low resistivity.

Poor step coverage is a drawback associated with sputtering or co-sputtering. Because the topography of the wafer surface is varied, good step coverage is necessary to avoid degradation or failure of the device. Sputtered and co-sputtered layers exhibit poor step coverage as compared to other prior art processes. The result of poor step coverage is localized thin spots which can produce overheating, electromigration of the conductor and, consequently, premature failure of the device.

Evaporation techniques include evaporation of metal on silicon or polysilicon and co-evaporation of metal and silicon on silicon, polysilicon, or oxides. The techniques use heat (resistive, inductive (RF), electron bombardment or laser) to vaporize the elements which are deposited on the substrate surface. One problem specifically associated with co-evaporation is consistency of the silicide composition from run to run. In addition, electron guns, commonly used as the heat source for refractory metal silicide formation, cause radiation damage to the substrate. Furthermore, step coverage by evaporation techniques is generally no better than the coverage produced by sputtering techniques.

Chemical vapor deposition (CVD) of silicides requires a chemical reaction of materials in the vapor phase or a reaction which occurs on the substrate surface. Chemical vapor deposition requires a high substrate temperature to produce a conductive coating (1,000° C.–1,100° C. for $TiSi_2$, See Wahl et al., "The CVD Deposition of Ti-Si Containing Coatings on Ni-Base Superalloys," *Proceedings of the Eighth International Conference on Chemical Vapor Deposition*, Electrochemical Society, Pennington, N.J., 1981, pp. 685–98). Unlike the step coverage problems associated with sputtering or evaporation of silicide films, CVD films exhibit good step coverage.

Cold wall, low pressure CVD processes have developed quite recently as an alternative to high substrate temperature processes. Examples of these processes are described in "Cold Wall, Low Pressure CVD Reactor", *Solid State Technology*, Nov. 1983, pp. 63–4 and Brors et al., "Properties of Low Pressure CVD Tungsten Silicide as Related to IC Processing Requirements," *Solid State Technology*, Volume 26, No. 183, Apr. 1983, pp. 183–6. The product, produced on a substrate heated to a low temperature, is either microcrystalline or amorphous. In order to produce a conductive layer, a high temperature anneal (1,000° C.–1,100° C.) is required.

A plasma induced CVD process is briefly disclosed in "Plasma Titanium-Silicide . . . Path of Least Resistance," *Solid State Technology,* Jan. 1984, p. 37. A principle drawback of this process is the distinct possibility of radiation damage to the substrate.

All of the processes described supra require high capital expeditures and considerable maintenance expenses in order to be effectively operated. In addition to the economic drawbacks, these processes are difficult to control and, therefore, the reproducability of chemically consistant products is a significant problem.

Most recently, laser induced chemical vapor deposition (LCVD) has been used to produce semiconducting, insulating and conductive (metal) coatings. The laser induced reactions cause the gaseous constituents to react and produce a coating on the substrate. References discussing the production of Si semiconductive layers, oxide and nitrite insulating layers and conductive metal layers include: U.S. Pat. No. 4,227,907; U.S. Pat. No. 4,270,997; U.S. Pat. No. 4,260,649; U.S. Pat. No. 4,324,854; Bilenchi et al., "Laser-Enhanced Chemical Vapor Deposition of Silicon," *Proceedings of the Eighth International Conference on Chemical Vapor Deposition,* Electrochemical Society, Pennington, N.J., 1981, pp. 275–83; Gattuso et al., "IR Laser-Induced Deposition of Silicon Thin Films," *Mat. Res. Soc. Proc.,* Volume 17, 1983, pp. 215–22; Allen et al., "Summary Abstract: Properties of Several Types of Films Deposited By Laser CVD," *Vac. Sci. Technol.,* Mar. 1983; and, Meunier et al., "Hydrogenated Amorphous Silicon Produced by Laser Induced Chemical Vapor Deposition of Silane," *Appl. Phys. Lett.* 43 (3), Aug. 1, 1983, pp. 273–5. In addition, a comprehensive list of documented laser induced reactions is disclosed in Steinfeld, "Laser-Induced Chemical Reactions: Survey of the Literature, 1965–1979, Plenum:New York, 1981, pp. 243–67.

An excellent method for overcoming the problems associated with the prior art processes is disclosed in related U.S. Pat. No. 4,568,565 entitled "Light Induced Chemical Vapor Deposition of Conductive Titanium Silicide Films". That application describes light induced chemical vapor deposition processes for forming conductive metal silicide containing films at low substrate temperatures.

We have discovered a process for forming conductive films comprising metal silicides which is simple and easily monitored (in terms of coating thickness, step coverage, etc.), requires low capital expenditures and yields chemically consistent products.

SUMMARY OF THE INVENTION

The invention includes processes for the production of conductive thin films and the conductive thin film products. The process comprises the steps of forming a suspension comprising ultrafine metal silicide powders in a solvent, depositing the suspension to form a layer on a surface of a substrate and heating at least the layer for a sufficient time to form a conductive thin film comprising polycrystalline metal silicide. The ultrafine powders employed in the process have a maximum dimension of less than or equal to about 2,000 angstroms and are preferably produced by a light induced powder production reaction. The heating temperature (about 1,000° C. or less) and heating time cooperate to produce a conductive thin film having a bulk resistivity of preferably about 200 $\mu\Omega$-cm or less. A highly conductive composition of the thin film is a refractory metal silicide-containing film which also includes silicon.

DETAILED DESCRIPTION OF THE INVENTION

The process of the present invention comprises the steps of producing a suspension comprising ultrafine metal silicide powders in a solvent, depositing the suspension onto a surface of a substrate to produce a layer thereon comprising the ultrafine metal silicide powders, and heating at least the layer for a sufficient time to produce a conductive film comprising polycrystalline metal silicide.

The suspension comprises ultrafine metal silicide powders in a solvent. Ultrafine powders are powders which have an axial dimension (i.e., a dimension taken along any axis passing through a particle of the powder) no larger than about 2,000 angstrom. Although very good results are obtained in the instant invention with powders approaching this dimensional limit, the best results are obtained with powders which have an axial dimension no larger than about 500 angstrom.

Many methods are available to produce ultrafine powders. They include such known techniques as pulverizing techniques which employ fluid energy mills, precipitation techniques which precipitate powders from solution and plasma induced reactions which produce powders from solids, liquids or gases. However, the ultrafine metal silicide powders employed in this invention are preferably produced by high intensity light induced reactions between vapor phase reactants. The process for producing the ultrafine powders comprises the steps of supplying gas phase reactants comprising a metallic compound and a silicon-containing compound to a reaction chamber, exposing the gases in the reaction chamber to high intensity light, and regulating the supply and exposure steps to produce ultrafine powders comprising metal silicide powders.

Figure 1:
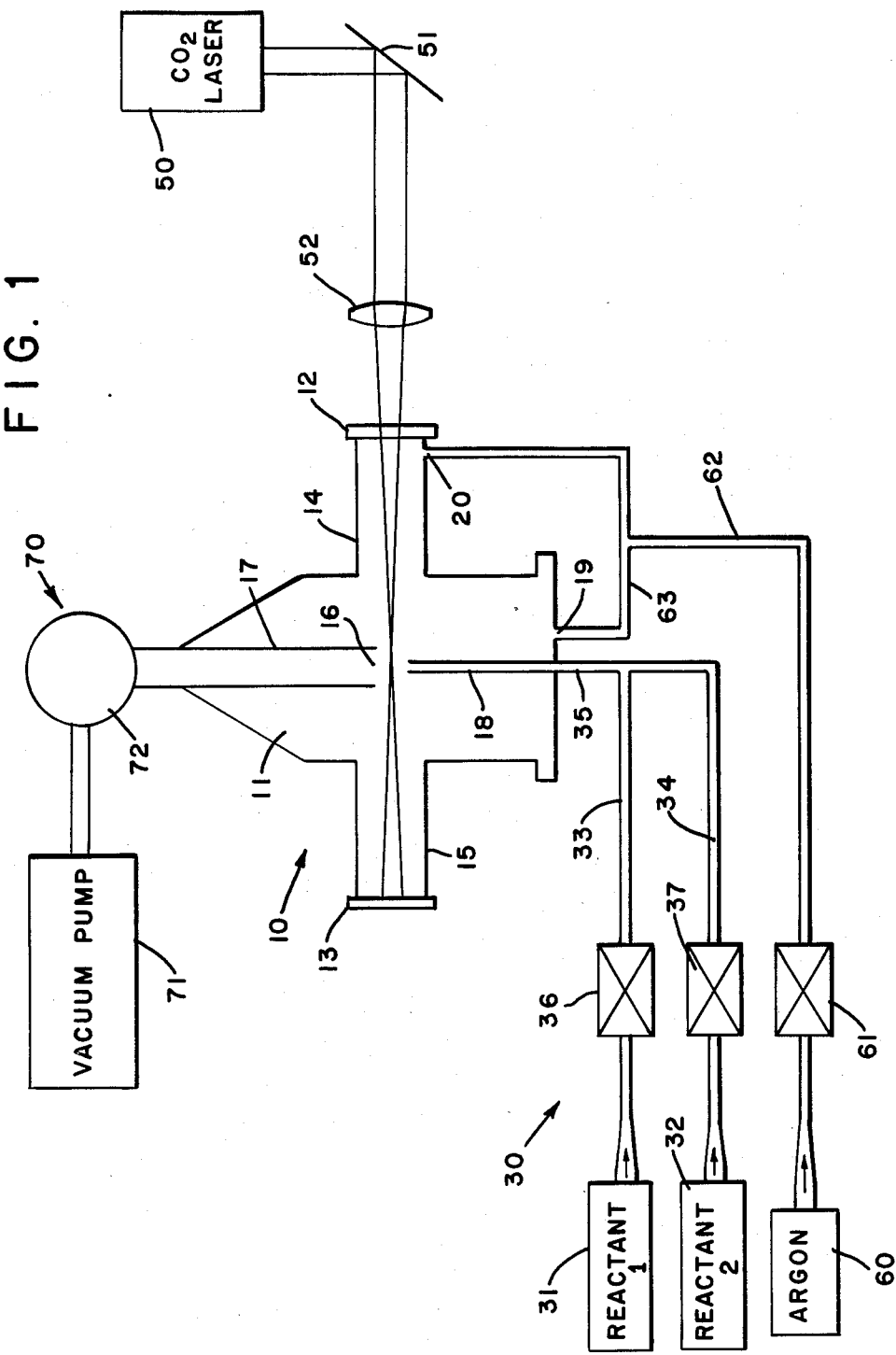
FIG. 1 is a schematic representation of an apparatus for producing the preferred powders employed in our inventive process.

The apparatus depicted in FIG. 1 is used to produce the ultrafine powders employed in the inventive process. The apparatus comprises a reactor 10, a gaseous reactant delivery system 30, a high intensity light source 50 and a reaction chamber evacuation system 70.

The reactor 10 consists of a stainless steel reactor chamber 11 with four flanged arms. A beam transparent window 12 (e.g., sodium chloride) and a water cooled beam stop 13 (e.g., anodized copper) are fixed to one collinear set of arms 14 and 15, respectively, to accommodate a high intensity beam of light. A second set of arms (oriented 90° to the first set; not shown) are usually fitted with viewing windows (e.g., Plexiglas) to observe the powder reaction zone 16. An evacuation port 17, arranged opposite a reactant supply port 18, removes powders from the reaction zone and aids in controlling chamber pressure. The reactant supply port 18 is positioned to feed gaseous phase reactants into the high intensity light beam. The reaction chamber also includes a carrier gas port 19 for carrying the powders from the reaction zone to the evacuation port 17. In addition, the reactor includes a purging gas port 20 for ensuring that no reactants deposit on the window.

Reactant gases are admitted at the bottom of the reactor through the reactant supply port 18. Reactants are supplied from separate sources 31 and 32 through the respective supply lines 33 and 34 to a mixing line 35 which is connected to the reactant supply port 18. Control of the flow ratio of the reactants (which determines the composition of the powders and the powder size) is accomplished by electronic mass flow control units 36 and 37. For reactants which are liquid at room temperature, bubblers (not shown) may be placed in the supply lines 33 and 34 and an inert gas (or hydrogen) is used as a carrier. In addition, heaters (not shown) may be employed after the bubbler to maintain the supply lines above the liquid condensation point. When a bubbler is employed, the temperature of the bubbler must be separately controlled to provide the desired vapor pressure of the liquid reactant.

The source of high intensity light 50 is preferably a laser. The laser can produce either a continuous beam, such as is produced by a $CO_2$ laser, or a pulse beam, such as is produced by an excimer laser. In the embodiment depicted in the drawing, the beam emanates from a $CO_2$ laser and is directed through the reaction chamber 11 by a molybdenum mirror 51. The beam is focused with a 10 inch focal length sodium chloride lens 52. The focal point is centered over the reactant supply port and located about 2 mm from the reactant supply port exit (approx. 0.6 mm in diameter). The 10 inch focal length lens produces (assuming Gaussian optics) a 0.5 mm beam waist (diameter) over a distance of about 9 mm.

An inert gas purge 60, with a separate flow controller 61, communicates with the reactor 10 via purging gas supply line 62 and the purging gas port 20 to prevent powder deposition on the window 12. The inert gas purge includes a second connection 63 communicating with carrier gas port 19, near the bottom of the reactor and adjacent the supply nozzle 18, to supply inert gas to the reactor at a sufficient flow rate to carry the powdered product out of the reactor chamber 11.

The evacuation system 70 comprises the evacuation port 17 (a quartz "chimney" of 1 cm inside diameter) which is connected to a mechanical pump 71. Positioned at the top of the reactor is a filter 72 (e.g., AAQ grade by Balstron, Inc.). The exhaust of the vacuum pump is discharged through a container (not shown; e.g., containing alkaline water) in order to convert any unreacted gas to harmless compounds.

Prior to feeding the reactants to the chamber, the chamber is initially evacuated to remove unwanted contaminants (e.g., $O_2$, $H_2O$). It should be understood that any one of a variety of evacuation systems can be employed which are capable of reducing the chamber pressure to about a few millitorr. For example, in the preferred apparatus, a Sargent-Welch Model 1402 mechanical rough pump (pumping speed=160 l/min) is used.

The reactant gases are supplied to the reactor chamber by any delivery system capable of controlling the flow rates of the reactants. The reactants are supplied by direct vaporization (i.e., heating; but to a temperature less than the temperature at which the gas phase reactants will react in the absence of high intensity light) or by providing a carrier gas to supply the reactants to the chamber. In a preferred embodiment of the invention, the silicon containing compound (a gas at room temperature) is directly supplied to the chamber and a metallic compound such as a metal halide (a liquid at room temperature) is carried to the reaction chamber by a gas carrier. When a gas carrier is used, it is preferred that it not react with the reactants. The preferred carrier gases include inert gases and hydrogen.

In accordance with the present invention, the metallic element is introduced into the reaction chamber as a metal halide, metal carbonyl or metal oxyhalide. The metallic elements of the metallic compounds which are contemplated include metals from Groups III–VI and the ferro metals of Group VIII of the Periodic Chart of the Elements. More specifically they include titanium, zirconium, hafnium, vanadium, niobium, tantalum, chromium, molybdenum, tungsten, iron, cobalt, nickel, palladium and platinum. The preferred metals include titanium, tantalum, molybdenum and tungsten. Among the metallic compounds, metal halides are preferred. The metal halides can include metal chlorides, metal fluorides, metal bromides and metal iodides. In addition to halides of principal valence of the aforementioned metals, subhalides, e.g., subchlorides or subfluorides could also be used. Further, mixtures of halides or halides and subhalides may also be used. Of the possible metal halides, metal chlorides and metal fluorides are preferred. The most preferred metal halides are metal chlorides. Examples of metal chlorides include titanium tetrachloride, zirconium tetrachloride, hafnium tetrachloride, tantalum pentachloride, vanadium pentachloride, niobium pentachloride, molybdenum chloride, tungsten hexafluoride, chromium chloride, ferric chloride and cobalt chloride.

The source of silicon is introduced into the reaction chamber as a gaseous silicon containing compound. The preferred class of compounds are hydrosilicides (silanes) e.g., $Si_xH_{2x+}$. Other potential sources of silicon include silicon tetrahalides, e.g., silicon tetrachloride and halogenated hydrosilicides, e.g., $SiH_3Cl$, $SiH_2Cl_2$ and $SiHCl_3$.

At least one of the gas of the metal halide and the gas of the silicon containing compound should be capable of absorbing the high intensity light produced by the source. In the event, however, that the reactants do not absorb the high intensity light, and additional chemically inert absorbing gas should be supplied in order to induce the reaction. Such absorbing gases can include Genetron®-11, Genetron®-12, Genetron®-113, Genetron®-114, $SiF_4$, $SF_6$, vinylchoride, perchloroethylene, trichloroethylene with $SF_6$ being preferred.

The flow ratio of the gases (standard cubic centimeter/min. (SCCM) of gas of metal halide per standard cubic centimeter/min. (SCCM) of gas of silicon containing compound) is variable depending on the desired composition of the powder. The ratio corresponds to an atomic flow ratio which produces a particular stoichiometry of the ultrafine metal silicide powders. Depending on the specific atomic flow ratio, the ultrafine powders can be characterized as metal compound-containing, stoichiometrically balanced or silicon-containing. The metal compound-containing or silicon-containing ultrafine powders (unbalanced stoichiometric compositions) comprise metal compound (e.g., $TiCl_3$ for an $SiH_4$-$TiCl_4$ reaction) and stoichiometric and/or non-stoichiometric metal silicide or stoichiometric and/or non-stoichiometric metal silicide and free silicon, respectively.

The reaction which produces the ultrafine powders comprising the metal silicide is induced by high intensity light. High intensity light is defined as light waves (ultraviolet, visible or infra red) of sufficient intensity to thermally induce or photolytically induce (or both) a reaction between gas phase reactants. Generally, a sufficient intensity of light would be at least about 10 watts/cm$^2$.

Any source may be used which is capable of producing high intensity light. Preferably, the high intensity light is produced by a laser. Any type of laser capable of producing high intensity light is suitable for use in the present invention; the $CO_2$ laser and the excimer laser are preferred. The laser may supply the light as a continuous beam or as individual pulses. In addition, the laser may be tuned (regulated to deliver a specific wavelength of light corresponding to a frequency absorbed by at least one of the gas phase reactants) or untuned (delivering a wavelength or set of wavelengths of light which are not regulated to necessarily correspond to a frequency absorbed by at least one of the gas phase reactants). For example, a tunable $CO_2$ laser can produce high intensity light with a frequency of 944.2 cm$^{-1}$ (this frequency corresponds to the P (20) emission line of the laser) which is strongly absorbed by $SiH_4$ reactant gas.

It is believed that the use of light produced by a $CO_2$ laser induces primarily a pyrolytic reaction. A pyrolytic reaction is a reaction which heats the vapor phase reactants by collision of non-absorbing reactives with absorbing reactives to a temperature at which the reactants decompose. When a $CO_2$ laser is employed, it is preferred that the intensity of light produced by the laser be at least about 100 watts/cm$^2$.

The reaction induced by an excimer laser is believed to be primarily a photolytic reaction. A photolytic reaction causes dissociation of at least one vapor phase reactant into free radicals which in turn react with the remaining reactant. When an excimer laser is employed, it is preferred that the laser produce at least about 10 pulses of light per second with each pulse lasting at least about 15 nanoseconds to yield an intensity on the order of megawatts/cm$^2$.

The production of ultrafine powders is also dependent on the reaction chamber pressure. The reaction chamber pressure is dependent on the reactant gas pressures, purging gas pressures and the control of the evacuation system. The gas pressures are controlled by the reactant temperatures and the electronic mass flow control units. The evacuation system is normally controlled by a needle valve provided in the exit port. The reaction chamber is maintained above about 100 torr for inducing homogeneous powder nucleation, with the range of between about 200 and about 500 torr being preferred.

The size of the ultrafine powders is controlled by specific process parameters. The final particle size is mainly dependent on the partial pressure of the gas phase reactants. Generally, an increase in total cell pressure causes the particle sizes to increase. Final particle size is also dependent on the intensity of the light; the higher the intensity, the smaller the particle size. Additionally, reactant gas velocity results in changes in reaction temperature and, consequently, the final particle size increases with decreasing gas velocities. Finally, the particle size (growth) also depends on the depletion of reactant gases. Dilution of the absorbing reactant gas will reduce the reaction zone temperature and the available reactant gas which in turn results in decrease particle size. A more detailed discussion of the process of making the ultrafine powders is described in Attorney Docket No. 82-2218, filed concurrently herewith, the disclosure of which is hereby incorporated by reference.

The ultrafine powders are dispersed in a solvent to form a suspension. On the basis of experiments done with a variety of different solvents, it is desirable to choose a solvent with a relatively high dielectric constant in order to produce a stable suspension. However, not all high dielectric solvents result in smooth, highly conductive films after sintering. This is believed to be due to reactions between powder impurities and the solvent. Lower dielectric constant solvents may also be used when coupled with surfactants. Surfactants can also be used when a high concentration of powder is contemplated for the suspension. Alcohols, generally, $C_1$-$C_5$ alcohols are solvents which are usable in the process. Preferred solvents include ethanol, pentanol and isopropanol. Water is also usable as a solvent but the resulting film exhibits a generally higher resistivity (factor of 2–4) than that which is produced by an alcohol-powder suspension. Additionally, it is important to choose a solvent which dries at a moderate rate so that it can be useful for spin-on or spray-on deposition. In our process, the solvent is ordinarily degassed prior to suspending the powders in the solvent by bubbling an inert gas (e.g., argon) through the solvent. We also prefer to avoid exposure of the powders to contamination from the time of powder formation at least through the step of forming the suspension.

After mixing the powders with the solvent, the powders are uniformly dispersed using a sonicator. Application of a sonicator to the mixture is desirable to break up any physically agglomerated powders which may be present. Any sonicator could be employed, e.g., a Model-225R sonicator manufactured by Heat Systems Ultrasonic, Inc. Equally effective could be the use of an ultrasonic dispenser for feeding the suspension onto the substrate.

The suspension is applied to a substrate by any known technique (for the formation of electrical components, known spin-on or spray-on techniques are preferred).

The substrate can be composed of any suitable material such as a wafer of silicon, polysilicon, alumina, silica, doped polysilicon, silicon nitride, composites of these materials, composites comprising metals and non-metals, metals or metal alloys, composites of metals or metal alloys, glasses, etc. Preferably, the wafers comprise materials selected from the group consisting of silicon, polysilicon, doped polysilicon, alumina, silicon nitride or silica.

After a layer is formed on the substrate, at least the layer is subjected to heat to form a conductive thin film. Heating of the layer is accomplished by any of a variety of techniques such as laser heating, electron or ion beam heating, etc. Heating of the entire composite can be accomplished by a simple technique, such as heating the composite in a furnace. Regardless of the method employed, the heating is preferably conducted with the substrate and layer being maintained in a vacuum or under an inert atmosphere. The temperature of a layer and substrate is preferably maintained at about 1,000° C. or less. Maintaining the temperature at 1,000° C. or less substantially reduces the possibility of adverse effects on the layer and substrate. In addition, the time of heating is controlled to regulate the degree of sintering which occurs. Depending on the heat source and the temperature, the time may range from less than one second to more than one hour.

The products produced by the process are either films comprising a polycrystalline metal silicide or composites comprising a substrate and a polycrystalline metal silicide containing film. The films produced by our process are substantially uniform in thickness and in electrical properties. The composition of the films can include stoichiometric metal silicides and/or stoichiometric metal silicides. The film may also include silicon.

The presence of free silicon in the films is an additional novel feature of the present invention. The concentration of silicon in the films is dependent on the weight % of Si in the powder and the degree of diffusion which occurs between the substrate and the film. We have determined that the silicon functions as a sintering aid which produces a more dense film and a more adherent film without substantially affecting the resistivity of the film. Additionally, the presence of Si reduces the sintering temperature and sintering time necessary to produce a highly conductive layer. The effect of Si in the films is observed to be beneficial as the concentration of Si varies between about 5 and about 50 weight percent. Above about 50 weight %, the resistivity of the film increases substantially and the utility of the film as a gate or gate interconnect is significantly diminished.

The thickness and resistivity of the film are variable depending on the desired structure and the intended use of the product. For integrated circuit components, such as gates and gate interconnects, film thickness is between about 2,000 Å to about 10,000 Å (1 $\mu$m). The resistivity is generally expressed in terms of the bulk resistivity of the film and is determined from measurements of surface resistivity. Our novel process produces film having a bulk resistivity below about 500 $\mu\Omega$-cm, generally below about 200 $\mu\Omega$-cm and in many instances less than or equal to about 100 $\mu\Omega$-cm.

The following examples describe production of conductive metal silicide films. Each of the samples was prepared using ultrafine powders produced by the preferred process and apparatus described supra.

EXAMPLE 1

25 mg of ultrafine powder comprising titanium silicide power containing 30 wt % excess silicon was mixed with 1.5 cc of ethanol and sonicated inside a glove box. The suspension as sprayed onto a polysilicon coated (approx. 3,000 angstrom) silicon wafer with sheet resistance of 14 $\Omega$/square. An artist's air brush with argon as the carrier gas was used for applying the suspension to the wafer. The sprayed wafer was heated in a vacuum at 950° C. for 30 min. The sheet resistance after sintering was measured to be 0.65 $\Omega$/square and the titanium silicide film was 7,500 angstrom thick (resistivity of the film=51 $\mu\Omega$-cm).

EXAMPLE 2

The powder mixture noted in Example 1 was sprayed onto a polysilicon coated wafer (sheet resistance=14 $\Omega$/square) and heated in a vacuum at 1,000° C. for 30 min. The sheet resistance after sintering was measured to be 0.45 $\Omega$/square and the film thickness was 7,500 angstrom (resistivity of the film=35 $\mu\Omega$-cm).

EXAMPLE 3

25 mg of ultrafine powder comprising titanium silicide powder containing 15.3 wt % of excess of silicon was mixed with 1.5 cc of isopropanol and sonicated. The suspension was sprayed onto a polysilicon coated silicon wafer with sheet resistance of 14 $\Omega$/square. The sprayed wafer was heated in vacuum at 950° C. or 30 min. The sheet resistance after sintering was measured to be 0.4 $\Omega$/square and the film thickness was about 10,000 angstrom (resistivity of the film=approx. 41 $\mu\Omega$-cm).

EXAMPLE 4

The powder mixture noted in Example 3 was sprayed onto a silicon wafer coated with 10,000 angstroms of thermally grown silicon oxide. The sprayed wafer was heated at 950° C. for 30 min. in vacuum. The sheet resistance of the titanium silicide film after sintering was measured to be 2.5 106 /square and the film was about 4,000 angstrom thick (resistivity of the film=100 $\mu\Omega$-cm).

EXAMPLE 5

Figure 2A:
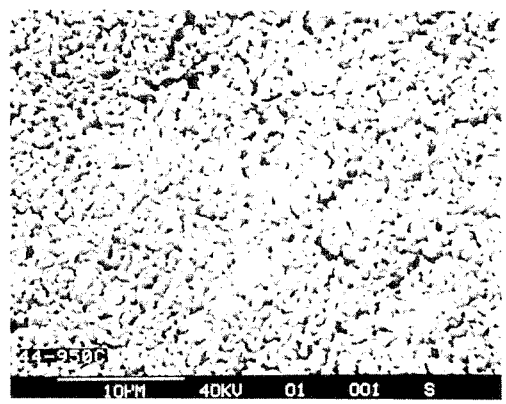
FIGS. 2a and 2b are scanning electron micrographs of a titanium silicide film formed by the process of the instant invention on a polysilicon coated silicon substrate.
Figure 2B:
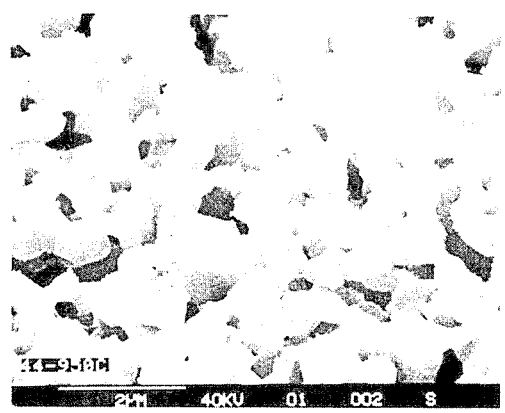

8 mg of ultrafine powder comprising titanium silicide powder containing 28.4 wt % excess silicon (and 9.1 wt % TiCl$_3$) was mixed with 0.5 cc of ethanol and sonicated. The suspension was sprayed onto a polysilicon coated silicon wafer with sheet resistance of 16 $\Omega$/square. The sprayed wafer was heated in vacuum at 950° C. for 30 min. The sheet resistance after sintering was measured to be 0.25 $\Omega$/square and the film thickness was about 30,000 (resistivity of the film≈80 $\mu\Omega$-cm). Scanning electron micrograph views of the film after firing are shown in FIGS. 2 and 2b. Although the film exhibits both isolated and interconnected pores (~1 micron), the film has a low resistivity.

EXAMPLE 6

Figure 3A:
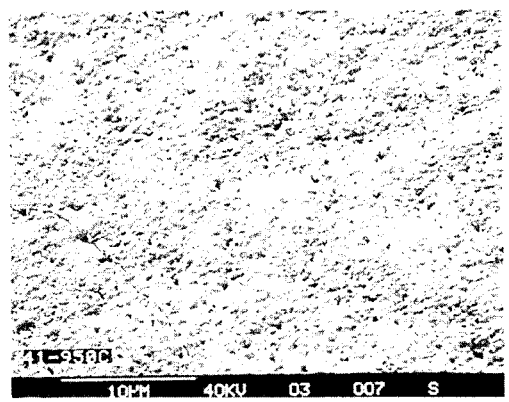
FIGS. 3a and 3b are scanning electron micrographs of a dense titanium silicide film formed by our process which contains a high percentage of free Si.
Figure 3B:
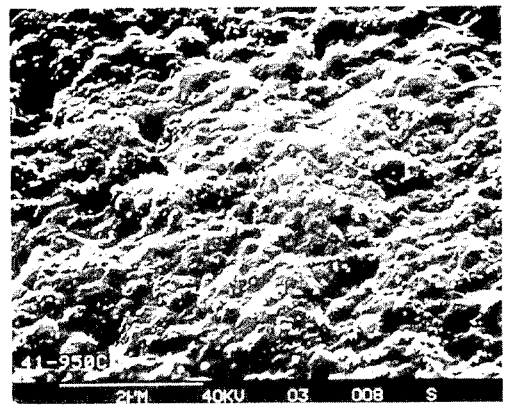

8 mg of ultrafine powder comprising titanium silicide powder containing 40.0 wt % excess silicon (and 5.8 wt % TiCl$_3$) was mixed with 0.5 cc of ethanol and sonicated. The suspension was sprayed onto a polysilicon coated silicon wafer with sheet resistance of 16 $\Omega$/square. The sprayed wafer was heated in vacuum at 950° C. for 30 min. The sheet resistance after sintering was measured to be 0.6 $\Omega$/square and the film thickness was about 50,000 Å (resistivity of the film≈300 $\mu\Omega$-cm). Scanning electron micrograph views of the film after firing are shown in FIGS. 3a and 3b. Unlike the film in Example 5, this film has very little porosity. The higher silicon content of the starting powder assists in the densification process. The film, however, has somewhat higher resistivity due to the higher silicon content.

EXAMPLE 7

8 mg of ultrafine powder comprising titanium silicide powder containing 17.3 wt % excess silicon was mixed with 0.5 cc of ethanol and sonicated. The suspension was sprayed onto a single *crystal* silicon wafer with resistivity of 10 $\Omega$-cm. The sprayed film was heated in vacuum at 900° C. for 30 min. The sheet resistance after sintering was measured to be 0.24 $\Omega$/ square and the film thickness as 40,000 Å (resistivity of the film=96 $\mu\Omega$-cm).

We claim:
1. A process for the production of a conductive film on a substrate comprising the steps of:

(a) depositing a suspension comprising powder and a solvent, said powder comprising ultrafine metal silicide powder and free silicon in an amount between about 5 and about 50% by weight of solids, onto a surface of a substrate to produce a layer thereon comprising the ultrafine metal silicide powder and free silicon; and, (b) heating at least the layer comprising the ultrafine metal silicide powder and free silicon for a sufficient time to sinter the layer and to produce a conductive film comprising polycrystalline metal silicide and free silicon.

2. A process as in claim 1 wherein the ultrafine powders are produced by a process comprising these steps of:

(1) supplying gas phase reactants to a reaction chamber, the gas phase reactants comprising a metal-containing compound and a silicon-containing compound;

(2) exposing the gases in the reaction chamber to high intensity light; and, (3) regulating steps (1) and (2) to produce ultrafine powders comprising a metal silicide.

3. A process as in claim 2 wherein the step of regulating the steps (1) and (2) includes regulating the supply of gas phase reactants to the reaction chamber to produce a total reaction chamber pressure of at least about 100 torr.

4. A process as in claim 2 wherein the high intensity light has an intensity of at least about 10 watts/cm$^2$.

5. A process as in claim 1 wherein the polycrystalline metal silicide has a stoichiometrically unbalanced composition.

6. A process as in claim 1 wherein at least the layer comprising ultrafine metal silicide powder and free silicon is heated to about 950° C. for at least about 30 minutes to produce the conductive film.

7. A process as in claim 1 wherein the solvent has a high dielectric constant.

8. A process as in claim 7 wherein the solvent is selected from the group consisting of $C_1$–$C_5$ alcohols.

9. A process as in claim 1 wherein the metal silicide powder is selected from the group consisting essentially of titanium silicide, molybdenum silicide, tungsten silicide, tantalum silicide, and mixtures thereof.

10. A process as in claim 1 wherein the suspension is deposited on the substrate surface by a spraying or spinning process.

11. A process as in claim 1 wherein at least the layer comprising ultrafine metal silicide powder and free silicon is heated to a temperature equal to or less than about 1,000° C.

12. A process as in claim 1 wherein at least the layer comprising ultrafine metal silicide powder and free silicon is heated to a sufficient temperature to produce a conductive film having a resistivity equal to or less than about 100 $\mu\Omega$-cm.

13. A process as in claim 1 wherein the depositing and heating steps function to produce adherence of the conductive film to the substrate.

14. A process as in claim 13 wherein the layer of ultrafine powders is heated to about 950° C. for at least about 30 minutes to produce the conductive film on a substrate comprising polysilicon.

15. A process as in claim 13 wherein the heating step further includes heating the substrate.

16. A process as in claim 13 wherein the substrate comprises a material selected from the group consisting of alumina, silicon, polysilicon, doped polysilicon, silicon nitride and silica.

17. A process as in claim 13 wherein the layer of ultrafine metal silicide powder and free silicon is heated to a sufficient temperature for a sufficient time to produce a conductive film having a resistivity equal to or less than about 100 $\mu\Omega$-cm.

18. The coated article comprising a substrate and a conductive film, said conductive film comprising polycrystalline metal silicide and free silicon in the range of about 5 to about 50 weight percent of said film and having a resistivity of less than about 100 $\mu\Omega$-cm.

19. The coated article of claim 17 wherein the substrate comprises a material selected from the group consisting of alumina, silicon, polysilicon, doped polysilicon, silicon nitride and silica.

* * * * *